United States Patent
Littlechild et al.

(10) Patent No.: US 9,152,909 B2
(45) Date of Patent: Oct. 6, 2015

(54) DEVICE HAVING DATA STORAGE

(71) Applicant: Sato Vicinity Pty Ltd, Clayton (AU)

(72) Inventors: Stuart Colin Littlechild, Haberfield (AU); Robert John Clarke, Heathpool (AU); Gary Michael Forsey, Chandlers Hill (AU)

(73) Assignee: Sato Vicinity Pty Ltd, Clayton (AU)

( * ) Notice: Subject to any disclaimer, the term of this patent is extended or adjusted under 35 U.S.C. 154(b) by 0 days.

(21) Appl. No.: 14/096,882

(22) Filed: Dec. 4, 2013

(65) Prior Publication Data

US 2014/0319226 A1    Oct. 30, 2014

Related U.S. Application Data

(63) Continuation of application No. 13/054,865, filed as application No. PCT/AU2009/000893 on Jul. 13, 2009, now abandoned.

(30) Foreign Application Priority Data

Jul. 21, 2008    (AU) .................................. 2008903728

(51) Int. Cl.
*G06K 19/06*    (2006.01)
*G06K 19/073*    (2006.01)
(Continued)

(52) U.S. Cl.
CPC .......... *G06K 19/073* (2013.01); *G06K 19/0701* (2013.01); *G06K 19/0723* (2013.01); *H02H 7/20* (2013.01)

(58) Field of Classification Search
USPC .................................. 235/375, 451, 492, 380
See application file for complete search history.

(56) References Cited

U.S. PATENT DOCUMENTS 4,121,102 A    10/1978 Wilson
4,145,761 A    3/1979 Gunter et al.
(Continued)

FOREIGN PATENT DOCUMENTS

EP    0427342 A1    5/1991
EP    0467036 A2    1/1992
(Continued)

OTHER PUBLICATIONS

Horiguchi, Masashi, et al., "Switched-Source-Impedance CMOS Circuit for Low Standby Subthreshold Current Giga-Scale LSI's," IEEE Journal of Solid-State Circuits, vol. 28, No. 11, Nov. 1993, pp. 1131-1135.
(Continued)

*Primary Examiner* — Tuyen K Vo
(74) *Attorney, Agent, or Firm* — Winstead PC

(57) ABSTRACT

Devices which store data for a period of time. In one form, devices store data in which the data store is subject to periodic and/or relatively short power outages. In one example, a radio frequency identification ("RFID") transponder, and more particularly, a RFID transponder that is used in orientation independent applications, is disclosed. Other applications are directed to devices used where a supply power is intermittent. In a first aspect of embodiments described herein, there is disclosed a method of and/or device that includes a memory adapted to store data, a supply of power adapted to provide supply power to the memory, a path of leakage, the leakage path serving, over time, to diminish the integrity of data stored in the memory, and a leakage attenuator adapted to selectively attenuate the rate of leakage.

27 Claims, 3 Drawing Sheets

(51) Int. Cl.
*G06K 19/07* (2006.01)
*H02H 7/20* (2006.01)

(56) References Cited

U.S. PATENT DOCUMENTS

| | | | |
|---|---|---|---|
| 4,303,904 A | 12/1981 | Chasek | |
| 4,399,821 A | 8/1983 | Bowers | |
| 4,441,125 A | 4/1984 | Parkinson | |
| 4,691,202 A | 9/1987 | Denne et al. | |
| 4,783,798 A | 11/1988 | Leibholz et al. | |
| 5,053,774 A | 10/1991 | Schuermann et al. | |
| 5,157,634 A | 10/1992 | Dhong et al. | |
| 5,258,762 A | 11/1993 | Cabon et al. | |
| 5,258,766 A | 11/1993 | Murdoch | |
| 5,300,875 A | 4/1994 | Tuttle | |
| 5,302,954 A | 4/1994 | Brooks et al. | |
| 5,351,052 A | 9/1994 | D'Hont et al. | |
| 5,351,187 A | 9/1994 | Hassett | |
| 5,365,551 A | 11/1994 | Snodgrass et al. | |
| 5,392,251 A | 2/1995 | Manning | |
| 5,430,441 A | 7/1995 | Bickley et al. | |
| 5,479,172 A | 12/1995 | Smith et al. | |
| 5,539,394 A | 7/1996 | Cato et al. | |
| 5,583,819 A | 12/1996 | Roesner et al. | |
| 5,590,082 A | 12/1996 | Abe | |
| 5,608,739 A | 3/1997 | Snodgrass et al. | |
| 5,629,981 A | 5/1997 | Nerlikar | |
| 5,638,433 A | 6/1997 | Bubien, Jr. et al. | |
| 5,842,118 A | 11/1998 | Wood, Jr. | |
| 5,850,181 A | 12/1998 | Heinrich et al. | |
| 5,892,706 A | 4/1999 | Shimizu et al. | |
| 6,005,638 A | 12/1999 | Blair et al. | |
| 6,034,603 A | 3/2000 | Steeves | |
| 6,037,879 A | 3/2000 | Tuttle | |
| 6,046,676 A | 4/2000 | Ward et al. | |
| 6,061,475 A | 5/2000 | Blair | |
| 6,097,622 A | 8/2000 | Shimizu et al. | |
| 6,294,953 B1 | 9/2001 | Steeves | |
| 6,404,325 B1 | 6/2002 | Heinrich et al. | |
| 6,414,318 B1 | 7/2002 | Uber, III et al. | |
| 6,462,647 B1 | 10/2002 | Roz | |
| 6,535,443 B1 | 3/2003 | OuYang et al. | |
| 6,570,487 B1 | 5/2003 | Steeves | |
| 6,597,620 B1 | 7/2003 | McMinn | |
| 6,603,400 B1 | 8/2003 | Shoobridge | |
| 6,856,581 B1 | 2/2005 | Berstis et al. | |
| 6,944,424 B2 | 9/2005 | Heinrich et al. | |
| 6,954,859 B1 | 10/2005 | Simerly et al. | |
| 7,005,985 B1 | 2/2006 | Steeves | |
| 7,215,251 B2 | 5/2007 | Hyde | |
| 7,259,654 B2 | 8/2007 | Littlechild et al. | |
| 7,271,727 B2 | 9/2007 | Steeves | |
| 7,286,158 B1 | 10/2007 | Griebenow | |
| 2002/0049918 A1 | 4/2002 | Kaxiras et al. | |
| 2002/0196212 A1 | 12/2002 | Nishitoba et al. | |
| 2003/0063511 A1* | 4/2003 | Hsu et al. | 365/204 |
| 2003/0137400 A1 | 7/2003 | Heinrich et al. | |
| 2003/0145241 A1 | 7/2003 | Hu et al. | |
| 2004/0042304 A1 | 3/2004 | Kirsch | |
| 2004/0156227 A1 | 8/2004 | Chu et al. | |
| 2005/0068799 A1* | 3/2005 | Bedwell et al. | 365/63 |
| 2005/0195139 A1 | 9/2005 | Shih et al. | |
| 2005/0237843 A1 | 10/2005 | Hyde | |
| 2006/0041769 A1 | 2/2006 | Hu et al. | |
| 2006/0066444 A1 | 3/2006 | Steeves | |
| 2006/0071756 A1 | 4/2006 | Steeves | |
| 2006/0176154 A1 | 8/2006 | Littlechild et al. | |
| 2007/0132556 A1 | 6/2007 | Littlechild et al. | |
| 2007/0147159 A1 | 6/2007 | Lee | |
| 2007/0279195 A1 | 12/2007 | Littlechild et al. | |
| 2009/0090946 A1 | 4/2009 | Lai et al. | |
| 2012/0132974 A1 | 5/2012 | Voldman | |
| 2012/0223304 A1* | 9/2012 | Yoneda | 257/43 |

FOREIGN PATENT DOCUMENTS

| | | |
|---|---|---|
| EP | 0585132 A1 | 3/1994 |
| EP | 0590590 A1 | 4/1994 |
| EP | 0702324 A2 | 3/1996 |
| EP | 0942385 A1 | 9/1999 |
| EP | 0945060 A2 | 9/1999 |
| EP | 0987646 A2 | 3/2000 |
| GB | 2259227 A | 3/1993 |
| JP | 2002261608 A | 9/2002 |
| JP | 2004306541 A | 11/2004 |
| WO | WO-9325918 A1 | 12/1993 |
| WO | WO-9827441 A1 | 6/1998 |
| WO | WO-9832092 A1 | 7/1998 |
| WO | WO-9916015 A2 | 4/1999 |
| WO | WO-9930401 A1 | 6/1999 |
| WO | WO-0004480 A1 | 1/2000 |
| WO | WO-0010144 A1 | 2/2000 |
| WO | WO-0016289 A1 | 3/2000 |
| WO | WO-0023941 A1 | 4/2000 |
| WO | WO-0042569 A1 | 7/2000 |
| WO | WO-0043932 A2 | 7/2000 |
| WO | WO-0045331 A1 | 8/2000 |
| WO | WO-0074062 A1 | 12/2000 |
| WO | WO-2007/030863 A1 | 3/2007 |

OTHER PUBLICATIONS

Li, Ying, "International Search Report" for PCT/AU2009/000893 as mailed Aug. 17, 2009, 5 pages.

Deepaksubramanyan, B., "Analysis of Subthreshold Leakage Reduction in CMOS Digital Circuits", IEEE, 2007, pp. 1400-1404.

* cited by examiner

DEVICE HAVING DATA STORAGE

This patent application is a continuation of U.S. patent application Ser. No. 13/054,865. U.S. patent application Ser. No. 13/054,865 is a national-stage filing of PCT/AU2009/000893. PCT/AU2009/000893 claims priority from AU2008903728. Each of the above-identified patent applications is incorporated by reference.

FIELD OF INVENTION

The present invention relates to the field of devices which store data for a period of time.

In one form, the invention relates to devices which store data in which the data store is subject to periodic and/or relatively short power outages. In one example, the invention relates to a radio frequency identification ("RFID") transponder, and more particularly to an RFID transponder that is used in orientation independent applications. Other applications of the present invention are to devices used where supply power is intermittent.

It will be convenient to hereinafter describe the invention in relation to an RFID transponder, however it should be appreciated that the present invention is not limited to that use only. The present invention may be applicable to a variety of devices in which data is to be maintained for a period of time.

BACKGROUND ART

Throughout this specification the use of the word "inventor" in singular form may be taken as reference to one (singular) Inventor or more than one (plural) inventor of the present invention. The discussion throughout this specification comes about due to the realisation of the inventor(s) and/or the identification of certain prior art problems by the inventors.

The inventors have realised that in, for example, a radio frequency identification ("RFID") transponder, and more particularly to an RFID transponder that is used in orientation independent and/or random orientation applications, the power supplied to components of the transponder can not be assured. For example, the power supplied to a memory resident in the transponder and which is adapted to store data can not be considered reliable in random and/or independent orientation environments. In these environments, in the event that the transponder orientation is changed and/or switched, power to the transponder and/or its components is lost, and as a result, data resident in the memory may be lost.

The inventors have also realised that some manner of storage of data, which is adapted to maintain the data, for example for a period of time greater than the power outage, is considered desirable. Furthermore, the inventors have realised that such a data store should also be adapted to validly maintain data stored in the memory for a period of time which provides a relatively long retention time. The period of time may be longer than the power outage, adapted to overcome switching of field during orientation changes and/or for any period of time as may be determined by the applications and/or environment to which the transponder or other device is applied.

U.S. Pat. No. 7,259,654 (also by the present applicant(s)) discloses a radio frequency identification transponder including a power supply and a memory array which stores data. When power from the power supply ceases to be provided, the data in the memory array is validly maintained for a predetermined period of time. The period of time is determined by discharging of the memory array through stray leakage paths within the memory array.

The inventors have realised that improvements can be made in the time data is validly maintained in a transponder. This comes about, in part, by the inventors identifying that leakage may be at least partially controlled and/or reduced.

The inventors have also realised that leakage, such as the stray leakage as disclosed in U.S. Pat. No. 7,259,654, is not the only leakage which may determine the time data is validly maintained in a transponder.

Any discussion of documents, devices, acts or knowledge in this specification is included to explain the context of the invention. It should not be taken as an admission that any of the material forms a part of the prior art base or the common general knowledge in the relevant art in Australia or elsewhere on or before the priority date of the disclosure and claims herein.

SUMMARY OF INVENTION

An object of the present invention is to reduce, attenuate and/or control leakage associated with a memory in a transponder.

It is an object of the embodiments described herein to overcome or alleviate at least one of the above noted drawbacks of related art systems or to at least provide a useful alternative to related art systems.

In a first aspect of embodiments described herein there is provided a method of and/or device comprising a memory adapted to store data, a supply of power adapted to provide supply power to the memory, a path of leakage, the leakage path serving, over time, to diminish the integrity of data stored in the memory, and a leakage attenuator adapted to control attenuation of the rate of leakage.

In another aspect of embodiments described herein there is provided a method of and/or device adapted to control leakage in a device comprising a memory adapted to store data, a supply of power adapted to provide supply power to the memory, a path of leakage, the leakage path serving, over time, to diminish the integrity of data stored in the memory, comprising providing a leakage attenuator adapted to control the rate of leakage, the leakage attenuator being associated with a leakage path of the memory.

Preferably, the time is less than 10 minutes, preferably less than 1 minute, more preferably less than 1 second. In one embodiment, the time is more than 50 msec.

Preferably, the leakage control is a form of multistage switch and/or a plurality of switches.

Preferably, the leakage is sub-threshold leakage.

In another aspect, the leakage attenuator comprises application of threshold adjustment.

Aspects of the present invention are directed to the control of the leakage and resultant improvement in storage time of data in memory of a transponder.

Other aspects and preferred aspects are disclosed in the specification and/or defined in the appended claims, forming a part of the description of the invention.

In essence, embodiments of the present invention stem from the realization that the problems aforementioned can be addressed by the use of leakage attenuation, such as the application of multiple switches (short and/or long channel) devices in series to in effect reduce sub-threshold leakage. The inventors have realised that Mosfets are only an approximation of a switch, and the fact that Mosfets are 'leaky' is the reason that the invention is required. The switches may be implemented as semiconductor devices such as mosfets, jfets, bipolar transistors, etc.

The use of threshold adjustment to set and/or increase the threshold of transistors to a desired value has also been found to have lower leakage.

The use of multiple switches and threshold adjustment may also be applied in combination. In other words, it is possible to provide a period of time which validly maintains data by using multiple devices and/or threshold adjustment to reduce, attenuate and/or control leakage, especially sub-threshold leakage.

Advantages provided by the present invention comprise the following:
- increase in the data retention time
- enables a relatively smaller storage cell configuration to be used for a given retention time
- reduces leakage currents
- provides a period of time during which data can be validly maintained in a data storage device without power being provided, especially in an RFID device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further disclosure, objects, advantages and aspects of the present application may be better understood by those skilled in the relevant art by reference to the following description of preferred embodiments taken in conjunction with the accompanying drawings, which are given by way of illustration only, and thus are not limitative of the present invention, and in which.

DETAILED DESCRIPTION

Figure 1:
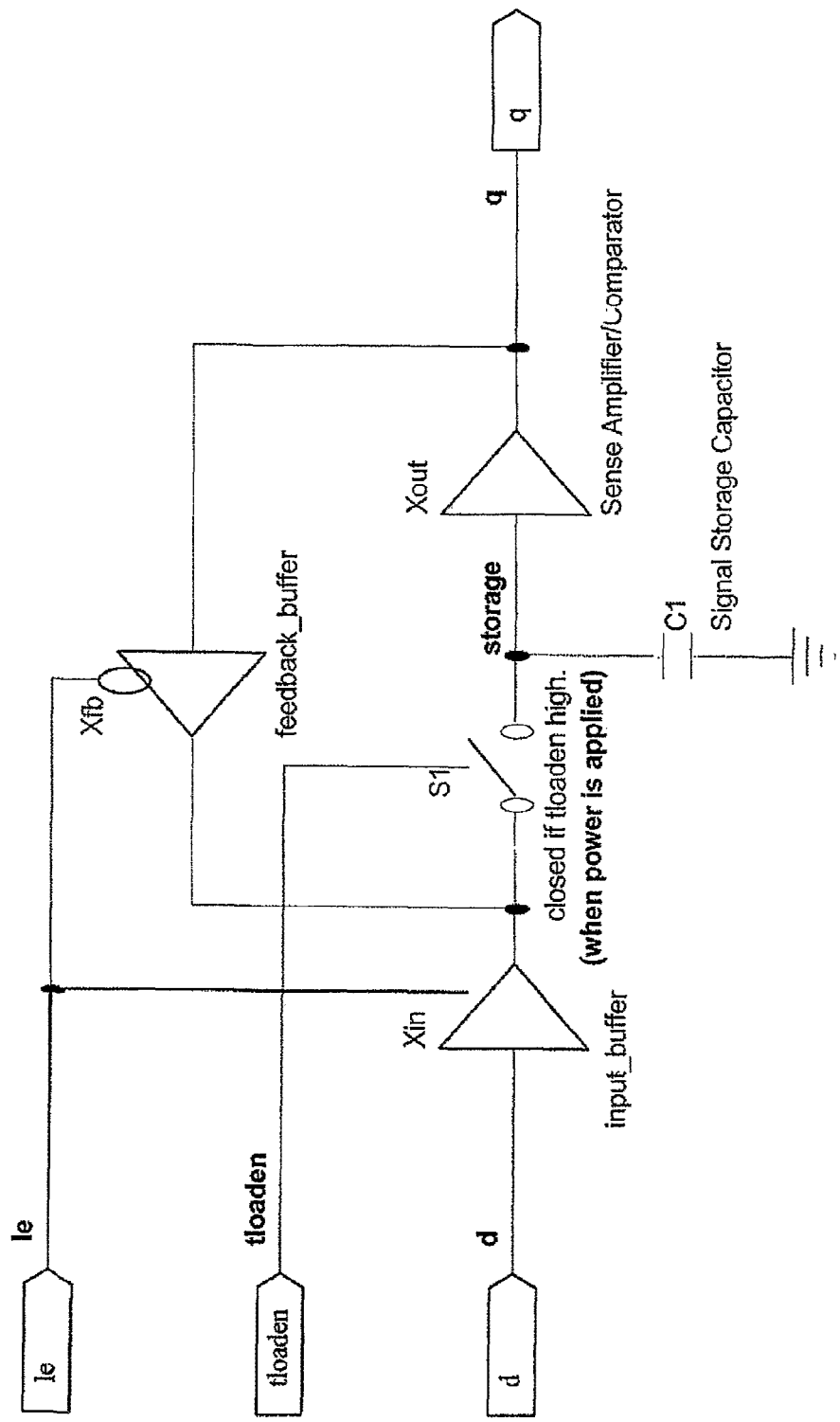
FIG. 1 illustrates one form of memory latch for a device, such as a transponder.

FIG. 1 represents a schematic for an "ideal" memory configuration in which data may be validly maintained in memory. There is a static latch (components Xin, Xout and Xfb), with the addition of a switch S1 and capacitor C1. The components S1 and C1 allow the latch to retain its state when power is removed from the circuit for relatively long periods of time.

The input buffer Xin buffers the signal d, whose value is stored in the latch when the latch enable input (le) is asserted high.

When le is de-asserted, the input buffer is disabled and the feedback buffer Xfb is enabled, applying the latch's output value back to its input so that it will retain state relatively indefinitely while power is applied to the circuit.

The component Xout is used to sense the state of the storage node to determine whether the reported output should be "1" or "0".

In some latches, this component may be a logic gate and the decision on output state is determined by whether or not the storage node voltage is above or below a logic threshold of that gate. It is equally possible to provide the sensing component using a schmitt trigger or an analog comparator. By way of comment, using a comparator allows relatively longer retention time because the threshold can be lower, but comparators are usually much larger than logic gates, so a trade-off is made when selecting the type of sensing component. By adding switch S1 and capacitor C1 to the circuit, the voltage at node 'storage' is retained even when power to the circuit is lost. When power is restored, the output buffer Xout restores the correct value of the output q when S1 is again closed.

This is true as long as tloaden is de-asserted before power to the circuit has decayed and as long as tloaden is not re-asserted until after power has been restored to the circuit.

If the switch S1 and capacitor C1 were ideal, and if there were no leakage into the input of Xout, the storage voltage would be retained indefinitely when power is removed. In the 'real world', however, circuits are not 'ideal' and the voltage across C1 does decay over time. There are various types of leakage in these circuits, such as:

Subthreshold leakage—the leakage across the switch S1. This is relatively significant for short channel transistors. The multi-transistor switch configuration and/or threshold adjustment of the present invention serves to reduce this leakage.

Junction leakage—the leakage through the reverse biased diode formed by the drain of the switch device (assuming it is an NFET).

Gate Oxide Leakage—the leakage through the gate oxide of the sensing circuit and also through the gate that forms the capacitor if a FET is used for this purpose. Gate oxide leakage is typically negligible in some processes but could be an issue for very fine line processes (e.g. 45 nm). In practice, a relatively significant leakage is the sub-threshold leakage.

Reducing this relatively significant leakage is the subject of the discussion that follows.

With regard to gate oxide leakage, and FIG. 1, component(s) Xout and/or C1 may be configured to have a relatively thick oxide layer which will serve to attenuate gate oxide leakage through his component. However, a thicker oxide layer will lower the capacitance value and thus necessitate a larger area to be used to form a capacitor. Thus a trade-off is made between gate oxide leakage and capacitance value. Increasing thickness decreases both leakage and capacitance, however we are aiming for relatively low leakage and relatively high capacitance).

A thicker oxide layer also reduces subthreshold leakage because the threshold is generally higher.

Figure 2:
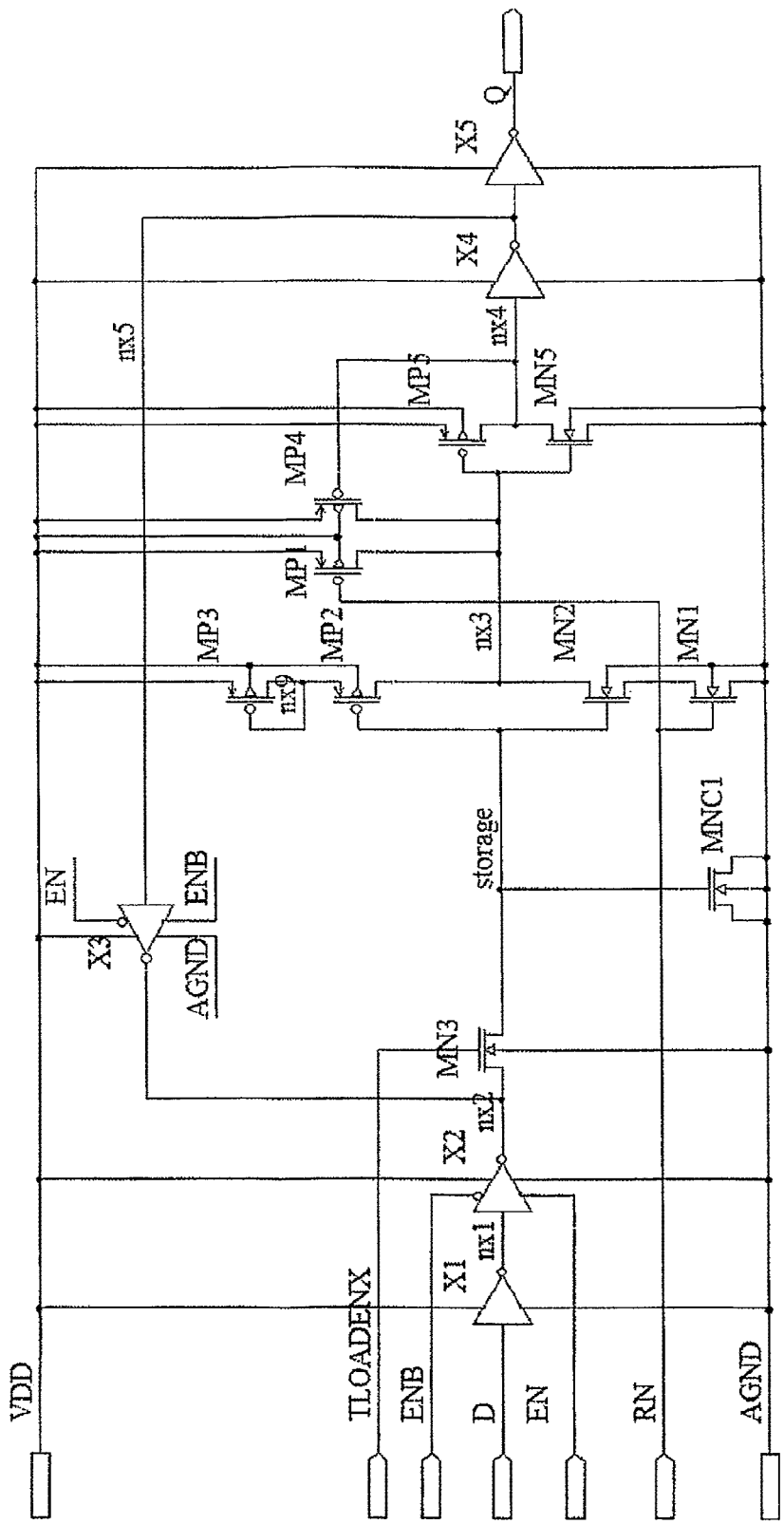
FIG. 2, illustrates another form of memory latch for a device.

FIG. 2 illustrates another form of temporary memory latch for a transponder. The input buffer is made up of components X1 and X2, the feedback buffer uses X3 and X4, and the output buffer uses the MOSFETs to the right of the storage capacitor as well as X4 (shared with the feedback buffer) and X5. The storage capacitor is implemented in this case using a MOSFET gate capacitor (MNC1) and the switch is implemented by the NMOS enhancement mode FET MN3.

It has been found that, inter alia, it is the leakage through MN3 when power is removed that limits the memory storage time. Leakage is a function of (amongst other variables) the threshold voltage of the transistor and also the transistor's drain-source voltage.

It can be determined from Deepaksubramanyan, B. S. and Nunex, A. "Analysis of Subthreshold Leakage reduction in CMOS Digital Circuits". proceedings of the 13th NASA VLSI Symposium, Post Falls, Idaho, USA, Jun. 5-6 2007 that the equation for sub-threshold leakage of a MOSFET is:

$$I_{SUB} = I_0 e^{\frac{(V_{gs} - V_{th\theta} - \eta V_{sb})}{(nV_\theta)}} \left(1 - e^{\frac{-V_{ds}}{V\theta}}\right)$$

and:

$$I_o = \mu C_{ox} \frac{W}{L} V_\theta^2 e^{1.8}$$

where
W and L are the width and length of the transistor, μ is the carried mobility, $$V_{theta} = \frac{kT}{Q}$$

is the thermal voltage, η is the slope shape factor/sub-threshold swing coefficient.

In another embodiment, by increasing the number of series transistors used in the "switch S1", the drain-source voltage across individual transistors could be substantially reduced. Furthermore, if the gate-source voltages of the individual devices whose sources are not at zero volts but are actually at a negative potential, this exponentially decreases the sub-threshold leakage (see the equation above). In the multiple switch approach, the fact that there are multiple sources with a common gate (which gets driven to substrate potential just prior to loss of power) means that transistors whose sources are at a higher potential than others (i.e., are closer to the storage node) have a negative gate-source voltage, which reduces the leakage of those devices in comparison to the transistor at the bottom of the stack, whose source voltage is 0 with respect to the substrate, resulting in a gate-source voltage of 0 volts.

Figure 3:
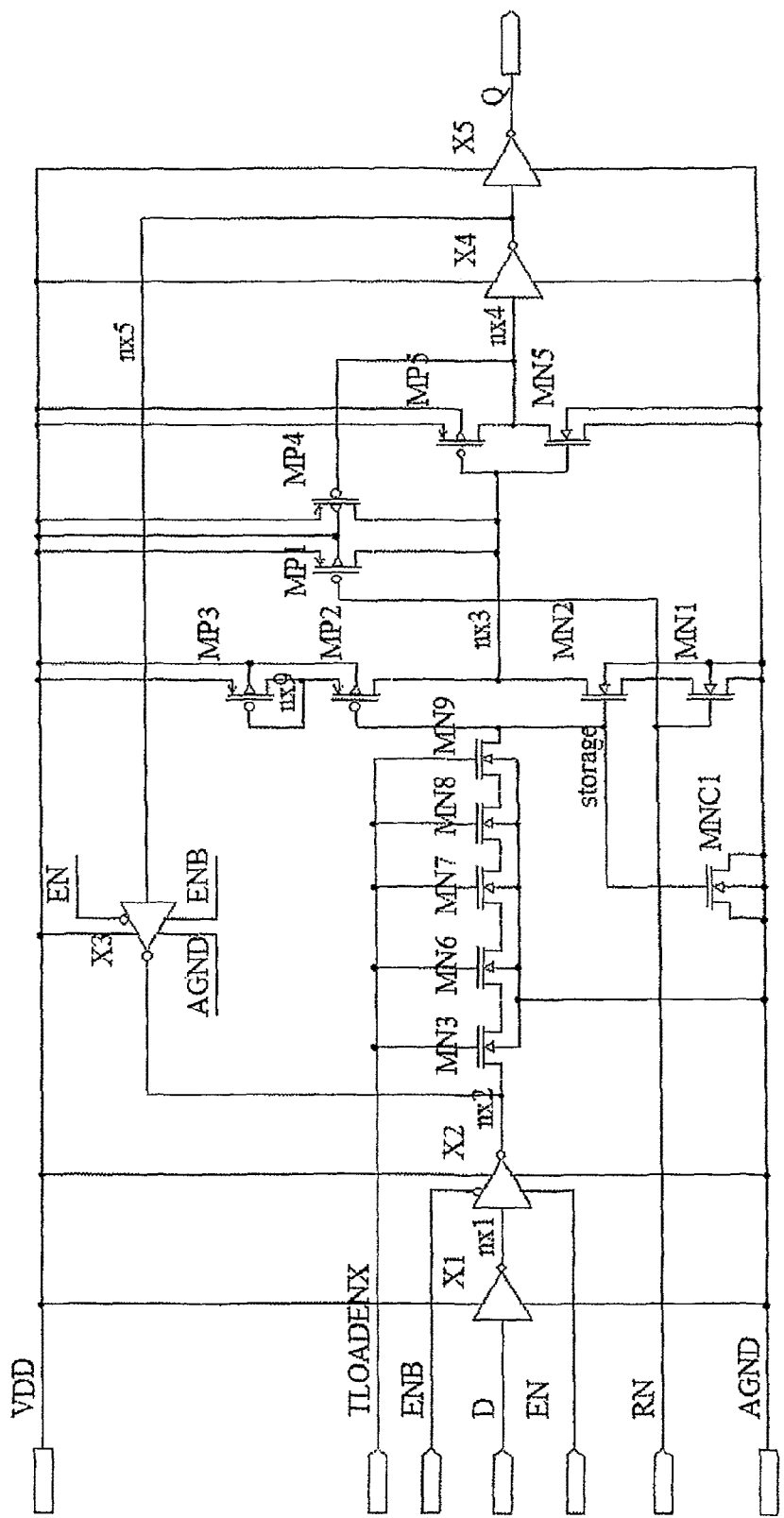
FIG. 3 illustrates yet another form of memory latch for a device incorporating an improvement according to an aspect of the present invention.

FIG. 3 illustrates one embodiment of this arrangement. The isolating switch in the cell Illustrated is composed of 5 separate short channel nMOS devices in series, namely transistors MN3, MN6, MN7, MN8 and MN9. The remainder of the circuit is relatively similar to that as illustrated in FIG. 2.

So by using multiple transistors In series, leakage may be attenuated, even substantially reduced, and this technique has been found to be much more effective than increasing the channel length of an individual switch device. Thus for devices which may be subject to power outage, the present invention may be applied to a memory which is adapted to hold data and by controlling the leakage in a manner which enables data stored in the memory to remain valid for a period of time longer than an outage of power associated with the memory.

One test of the present invention has revealed an improvement of retention time as compared to, for example an embodiment disclosed in U.S. Pat. No. 7,259,654, for example:

| Temperature | Retention Time (single transistor) | Retention Time (5 series transistors) | improvement |
|---|---|---|---|
| Room Temp (25 C.) | 140 ms | 430 ms | 2.9x |
| +60 C. | 15 ms | 89 ms | 5.9x |

It has also been realised by the inventors that modem processes are designed to have quite small threshold voltages and this means that their leakage
Increases (they are not as firmly "off" when their gate-source is at zero volts).

It is known in modern IC manufacturing technologies to apply a threshold adjustment implant to set the threshold of transistors to a desired value. Transistors with higher threshold have been found to have lower leakage. The threshold of the transistors is increased by this implant and thus leakage is reduced. This can be applied to devices which store data in order to alleviate the problem of sub-threshold leakage.

Thus rather than increasing the channel length to reduce leakage, it has been found to be also effective to use a plurality of channel devices to reduce leakage. In other words, it is possible to provide a period of time which validly maintains data by using multiple devices and/or threshold adjustment to reduce, attenuate and/or control leakage, especially sub-threshold leakage.

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. The described embodiments are to be considered in all respects as illustrative only and not restrictive.

Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures. For example, although a nail and a screw may not be structural equivalents in that a nail employs a cylindrical surface to secure wooden parts together, whereas a screw employs a helical surface to secure wooden parts together, in the environment of fastening wooden parts, a nail and a screw are equivalent structures.

It should also be noted that where a flowchart is used herein to demonstrate various aspects of, the invention, it should not be construed to limit the present invention to any particular logic flow or logic implementation. The described logic may be partitioned into different logic blocks (e.g. programs, modules, functions, or subroutines) without changing the overall results or otherwise departing from the true scope of the invention. Often, logic elements may be added, modified, omitted, performed in a different order, or implemented using different logic constructs (e.g. logic gates, looping primitives, conditional logic, and other logic constructs) without changing the overall results or otherwise departing from the true scope of the invention.

Various embodiments of the invention may be embodied in many different forms, including computer program logic for use with a processor (e.g. a microprocessor, microcontroller, digital signal processor, or general purpose computer), programmable logic for use with a programmable logic device (e.g. a Field Programmable Gate Array (FPGA) or other PLD), discrete components, integrated circuitry (e.g. an Application Specific Integrated Circuit (ASIC)), or any other means including any combination thereof. In an exemplary embodiment of the present invention, predominantly all of the communication between users and the server is implemented as a set of computer program instructions that is converted into a computer executable form, stored as such in a computer readable medium, and executed by a microprocessor under the control of an operating system.

Computer program logic implementing all or part of the functionality where described herein may be embodied in various forms, including a source code form, a computer executable form, and various intermediate forms (e.g. forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g. via an interpreter), or the source code may be converted (e.g., via a translator, assembler, or compiler) into a computer executable form.

The computer program may be fixed in any form (e.g. source code form, computer executable form, or an intermediate form) either permanently or transitorily in a tangible storage medium, such as a semiconductor memory device (e.g. a RAM, ROM, PROM, EEPROM, or Flash-Programmable RAM), a magnetic memory device (e.g., a diskette or fixed disk), an optical memory device (e.g., a CD-ROM or DVD-ROM), a PC card (e.g. PCMCIA card), or other memory device. The computer program may be fixed in any form in a signal that is transmittable to a computer using any of various communication technologies, including, but in no way limited to, analog technologies, digital technologies, optical technologies, wireless technologies (e.g. Bluetooth), networking technologies, and inter-networking technologies. The computer program may be distributed in any form as a removable storage medium with accompanying printed or electronic documentation (e.g. shrink wrapped software), preloaded with a computer system (e.g. on system ROM or fixed disk), or distributed from a server or electronic bulletin board over the communication system (e.g. the Internet or World Wide Web).

Hardware logic (including programmable logic for use with a programmable logic device) implementing all or part of the functionality where described herein may be designed using traditional manual methods, or may be designed, captured, simulated, or documented electronically using various tools, such as Computer Aided Design (CAD), a hardware description language (e.g. VHDL or AHDL), or a PLD programming language (e.g. PALASM, ABEL, or CUPL).

Programmable logic may be fixed either permanently or transitorily in a tangible storage medium, such as a semiconductor memory device (e.g. a RAM, ROM, PROM, EEPROM, or Flash-Programmable RAM), a magnetic memory device (e.g. a diskette or fixed disk), an optical memory device (e.g. a CD-ROM or DVD-ROM), or other memory device. The programmable logic may be fixed in a signal that is transmittable to a computer using any of various communication technologies, including, but in no way limited to, analog technologies, digital technologies, optical technologies, wireless technologies (e.g. Bluetooth), networking technologies, and internetworking technologies. The programmable logic may be distributed as a removable storage medium with accompanying printed or electronic documentation (e.g. shrink wrapped software), preloaded with a computer system (e.g. on system ROM or fixed disk), or distributed from a server or electronic bulletin board over the communication system (e.g. the Internet or World Wide Web).

"Comprises/comprising" when used in this specification is taken to specify the presence of stated features, integers, steps or components but does not preclude the presence or addition of one or more other features, integers, steps, components or groups thereof." Thus, unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

The invention claimed is:

1. A device comprising:
   a memory adapted to store data;
   a supply of power adapted to provide supply power to the memory;
   a leakage path, the leakage path serving, over time, to diminish integrity of data stored in the memory; and
   a leakage attenuator comprising a plurality of serially coupled switches and adapted to control attenuation of a rate of leakage due to the leakage path when the supply of power has been removed from the device.

2. The device as claimed in claim 1, wherein the leakage attenuator is adapted to enable selection of a degree of attenuation of the rate of leakage.

3. The device as claimed in claim 1, wherein the leakage attenuator comprises a multistage switch.

4. The device as claimed in claim 3, wherein the multistage switch comprises a MOSFET.

5. The device as claimed in claim 1, wherein the leakage attenuator serves to perform at least one of reduce, attenuate control leakage associated with the memory.

6. The device as claimed in claim 1, wherein the memory comprises a memory cell.

7. The device as claimed in claim 1, wherein the leakage is sub-threshold leakage.

8. The device as claimed in claim 1, wherein the device is a transponder.

9. The device as claimed in claim 8, wherein the device is an RFID transponder.

10. The device as claimed in claim 1, wherein the time is less than 10 minutes.

11. The device as claimed in claim 1, wherein the time is less than 1 minute.

12. The device as claimed in claim 1, wherein the time is less than 1 second.

13. The device as claimed in claim 12, wherein the time is more than 50 msec.

14. A method of controlling leakage in a device comprising:
   a memory adapted to store data;
   a supply of power adapted to provide supply power to the memory;
   a leakage path, the leakage path serving, over time, to diminish integrity of data stored in the memory, the method comprising:
      providing a leakage attenuator adapted to control a rate of leakage due to the leakage path, the leakage attenuator being associated with the leakage path; and
      wherein the leakage attenuator comprises a plurality of serially coupled switches and controls attenuation of the rate of leakage when the supply of power has been removed from the device.

15. The method as claimed in claim 14, where the leakage attenuator reduces sub-threshold leakage.

16. The method as claimed in claim 14, further comprising the step of providing a multistage switch as the leakage control device.

17. The method as claimed in claim 14, wherein the leakage attenuator is a plurality of switches.

18. The method as claimed in claim 14, wherein the leakage attenuator applies threshold adjustment.

19. The method as claimed in claim 14, further comprising controlling the leakage in a manner which enables data stored in the memory to remain valid for a period of time longer than an outage of power associated with the memory.

20. The method as claimed in claim 14, further comprising applying the method to a transponder.

21. The method of claim 20, wherein the transponder is selected from the group consisting of an RFID transponder and a passive device.

22. An apparatus adapted to controlling leakage in a device, said apparatus including:
   processor means adapted to operate in accordance with a predetermined instruction set; and
   said apparatus, in conjunction with said instruction set, being adapted to perform the method as claimed in claim 14.

23. The method as claimed in claim 14, wherein the time is less than 10 minutes.

24. The method as claimed in claim 14, wherein the device is an RFID transponder.

25. The method as claimed in claim 14, wherein the time is less than 1 minute.

26. The method as claimed in claim 14, wherein the time is less than 1 second.

27. The method as claimed in claim 26, wherein the time is more than 50 msec.

* * * * *